(12) United States Patent
Chen et al.

(10) Patent No.: US 8,357,964 B1
(45) Date of Patent: Jan. 22, 2013

(54) THREE-DIMENSIONAL DYNAMIC RANDOM ACCESS MEMORY WITH AN ANCILLARY ELECTRODE STRUCTURE

(75) Inventors: Chih-Yuan Chen, Taichung (TW); Meng-Hsien Chen, Taichung (TW); Chih-Wei Hsiung, Taichung (TW)

(73) Assignee: Rexchip Electronics Corporation, Taichung (TW)

( * ) Notice: Subject to any disclaimer, the term of this patent is extended or adjusted under 35 U.S.C. 154(b) by 0 days.

(21) Appl. No.: 13/227,315

(22) Filed: Sep. 7, 2011

(51) Int. Cl.
*H01L 27/108* (2006.01)
*H01L 29/94* (2006.01)
(52) U.S. Cl. .......................................... 257/306
(58) Field of Classification Search ............. 257/306
See application file for complete search history.

(56) References Cited

U.S. PATENT DOCUMENTS 5,166,762 A * 11/1992 Yoshida .................... 257/302
7,795,620 B2    9/2010 Huang

* cited by examiner

*Primary Examiner* — Calvin Lee
*Assistant Examiner* — Monica D Harrison
(74) *Attorney, Agent, or Firm* — Muncy, Geissler, Olds & Lowe, PLLC

(57) ABSTRACT

A three-dimensional dynamic random access memory with an ancillary electrode structure includes a substrate, at least one bit line formed on the substrate, at least one pillar element formed on a growth zone of the bit line, an ancillary electrode, a character line parallel with the substrate and perpendicular to the bit line, and at least one capacitor connecting to the pillar element. The bit line is formed on the substrate by doping and diffusing a doping element. The ancillary electrode is located on a separation zone of the bit line and adjacent to the pillar element. The character line is insulated from the ancillary electrode and incorporates with the bit line to output or input electronic data to the capacitor. Through the ancillary electrode, impedance of the bit line can be controlled to enhance conductivity of the bit line.

8 Claims, 10 Drawing Sheets

THREE-DIMENSIONAL DYNAMIC RANDOM ACCESS MEMORY WITH AN ANCILLARY ELECTRODE STRUCTURE

FIELD OF THE INVENTION

The present invention relates to a three-dimensional dynamic random access memory (DRAM) and particularly to a three-dimensional DRAM with an ancillary electrode structure.

BACKGROUND OF THE INVENTION

With continuous advance of semiconductor manufacturing technology the electronic elements are shrunk smaller while their performances are greatly enhanced. The general semiconductor manufacturing process mainly aims to shrink the size of transistors to increase circuit integrated density of elements so that switch speed of the shrunk elements improves and power consumption is reduced at the same time, thereby to enhance the performance of the elements. In order to increase production yield the shrunk elements must be fabricated via etching processes and equipments with precise control.

In the technology area of DRAM reducing circuit area makes fabricating more memory chips possible with a given wafer to lower the cost. To meet this end vertical DRAM becomes the mainstream now. It can be divided into a trench capacitor structure and a stacked capacitor structure that are widely adopted in the industry. They can shrink the size of the memory and better utilize chip space to fabricate high density DRAM. For instance, U.S. Pat. No. 7,795,620 entitled "Transistor structure and dynamic random access memory structure including the same" discloses a surrounding gate transistor (SGT). It adopts the vertical transistor stacked structure to reduce wafer occupied area.

FIG. 1 illustrates a conventional vertical pillar transistor (VPT) which includes a bit line 1, a silicon substrate 2, a vertical transistor 3 and a capacitor 4. The bit line 1 is formed on the surface of the silicon substrate 2 via an ion-doping method. Although forming the bit line 1 via such a method is exempt from the process of burying metal lines by etching to simplify fabrication process and also get smaller couple noise, the bit line thus formed has impedance much greater than the one formed by the metal lines, that results in loss during signal transmission and decrease of electric charges saved in the capacitor 4. There is still room for improvement.

SUMMARY OF THE INVENTION

The primary object of the present invention is to solve the problem of high impedance of bit lines formed by ion-doping.

To achieve the foregoing object, the present invention provides a three-dimensional DRAM with an ancillary electrode structure. It includes a substrate, at least one bit line formed on the substrate, at least one pillar element formed on the bit line, a first dielectric layer, at least one ancillary electrode, a second dielectric layer, at least one character line parallel with the substrate and perpendicular to the bit line, and at least one capacitor. The bit line is formed on the substrate by doping and diffusing a doping element. The bit line has a growth zone and a separation zone. The pillar element is formed on the growth zone and has a top wall remote from the bit line and a side wall between the bit line and top wall. The side wall is perpendicular to the bit line. The first dielectric layer is formed on the separation zone between the bit lines and the surface of the pillar element. The top wall of the pillar element has an opening leading to the capacitor. The ancillary electrode is formed on the surface of the first dielectric layer corresponding to the separation zone and adjacent to the pillar element. The second dielectric layer is connected to the first dielectric layer and encases the ancillary electrode. The character line is formed on the surface of the first dielectric layer remote from the side wall, and spaced from the ancillary electrode with the second dielectric layer.

Through the structure set forth above, by forming the ancillary electrode on the separation zone, the impedance of the bit line can be controlled through the first dielectric layer to enhance conductivity of the bit line. Moreover, the fabrication structure and process of the invention are similar to the fabrication process of the vertical pillar transistor, hence provide great fabrication compatibility.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1:
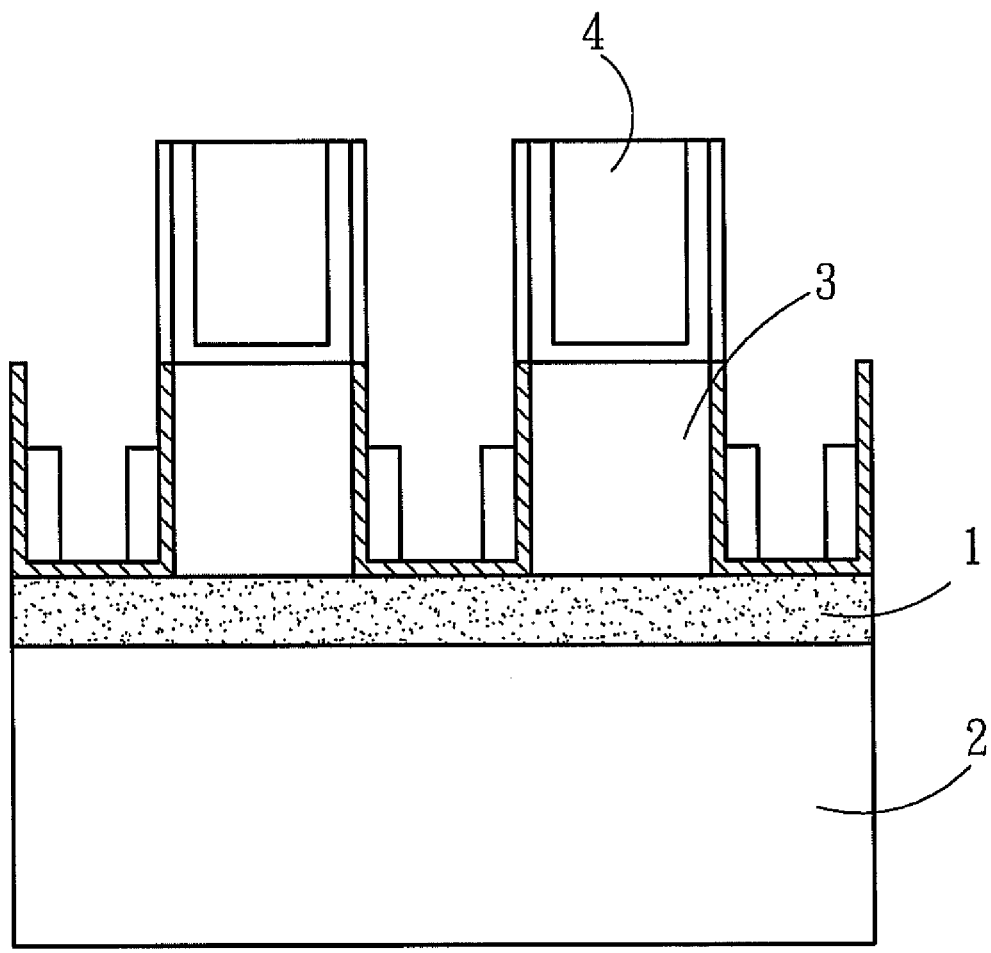
FIG. 1 is a schematic view of a conventional technique.
Figure 2A:
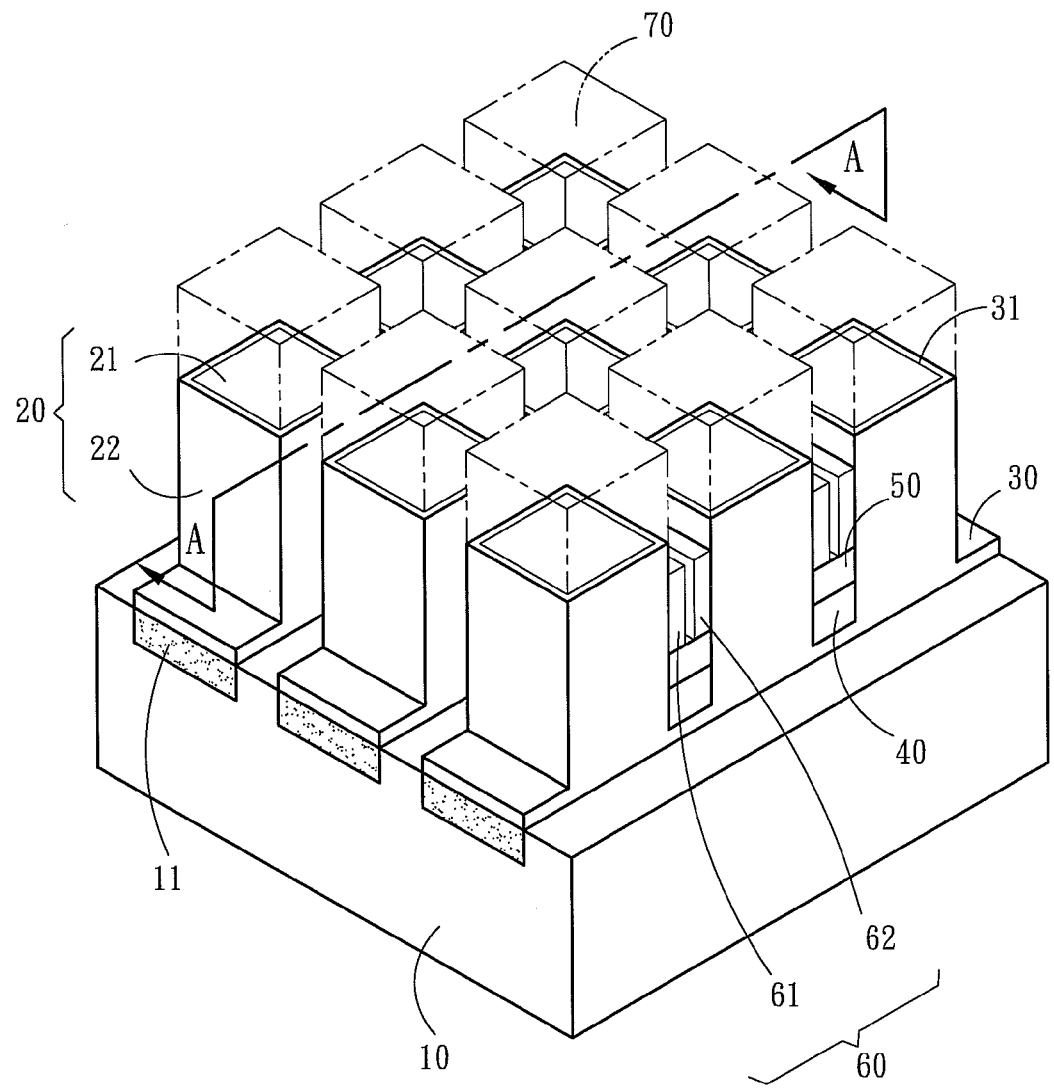
FIG. 2A is a perspective view of an embodiment of the invention.
Figure 2B:
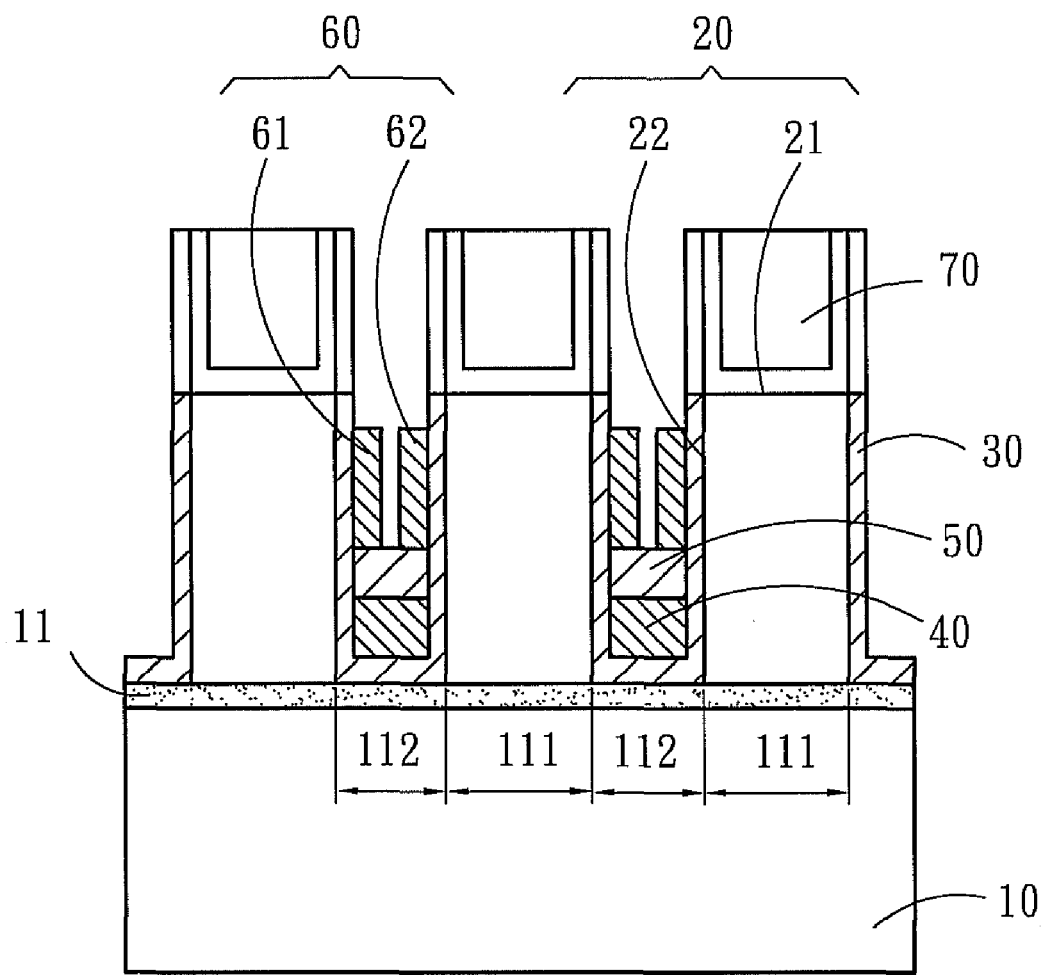
FIG. 2B is a sectional view according to FIG. 2A.

Please referring to FIGS. 2A and 2B, the present invention aims to provide a three-dimensional DRAM with an ancillary electrode structure. It includes a substrate 10, at least one bit line 11 formed on the substrate 10, at least on pillar element 20 formed on the bit line 11, a first dielectric layer 30, at least one ancillary electrode 40, a second dielectric layer 50, at least one character line 60 parallel with the substrate 10 and perpendicular to the bit line 11, and at least one capacitor 70.

The bit line 11 is formed on the substrate 10 by doping and diffusing a doping element. The doping element is a 3A or 5A group element to allow the bit line 11 to become a P-type or N-type semiconductor. The doping and diffusion can be undertaken through an ion implantation technique, a furnace doping and diffusion technique, a plasma diffusion technique or the like. The bit line 11 has a growth zone 111 and a separation zone 112. In this embodiment a plurality of growth zones 111 and separation zones 112 are provided that are spaced from each other and laid on the substrate 10. The bit line 11 also includes multiple sets parallel with and spaced from each other on the substrate 10. The pillar element 20 is formed on the growth zone 111 and has a top wall 21 remote from the bit line 11 and a side wall 22 between the bit line 11 and top wall 21. The side wall 22 is perpendicular to the bit line 11. In this embodiment multiple pillar elements 20 are provided corresponding to the growth zones 111.

The first dielectric layer 30 is formed on the separation zone 112 of the bit line 11 and the surface of pillar element 20, and has an opening 31 on the top wall 21. The ancillary electrode 40 is formed on the surface of the first dielectric layer 30 corresponding to the separation zone 112 and adjacent to the pillar element 20. The ancillary electrode 40 is located between two neighboring pillar elements 20 and parallel with the surface of the substrate 10 and perpendicular to the bit line 11. The second dielectric layer 50 is connected to the first dielectric layer 30 and encases the ancillary electrode 40 within the separation zone 112 to prevent forming electric connection between the ancillary electrode 40 and other elements. The character line 60 includes a first character line 61 and a second character line 62 that are formed on the surface of the first dielectric layer 30 remote from the side wall 22. More specifically, the first and second character lines 61 and 62 are formed respectively on one side of neighboring side walls 22 of the pillar elements 20, and spaced from the ancillary electrode 40 via the second dielectric layer 50 without contacting with each other. In this embodiment multiple character lines 60 are provided corresponding to the bit lines 11 and formed in an array fashion with the bit lines 11. The capacitor 70 is formed on the top wall 21 and connected to the pillar element 20 through the opening 31.

Figure 3A:
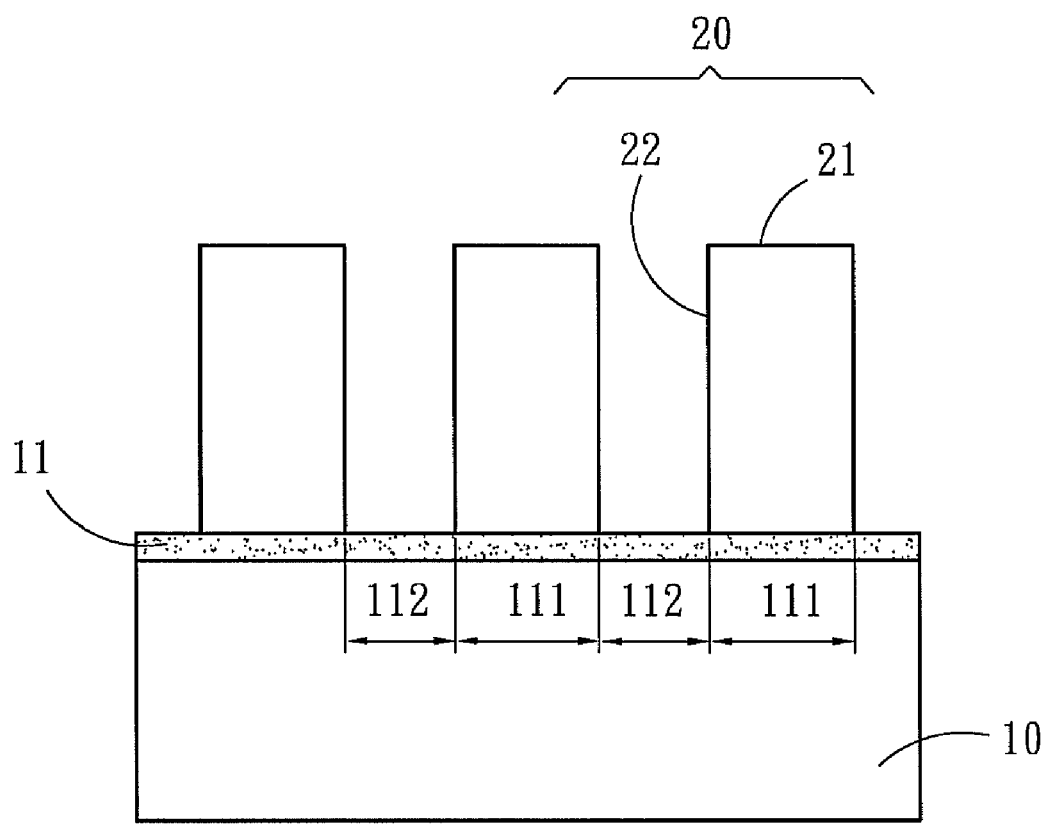
FIGS. 3A through 3F are schematic views of fabrication processes of an embodiment of the invention.
Figure 3B:
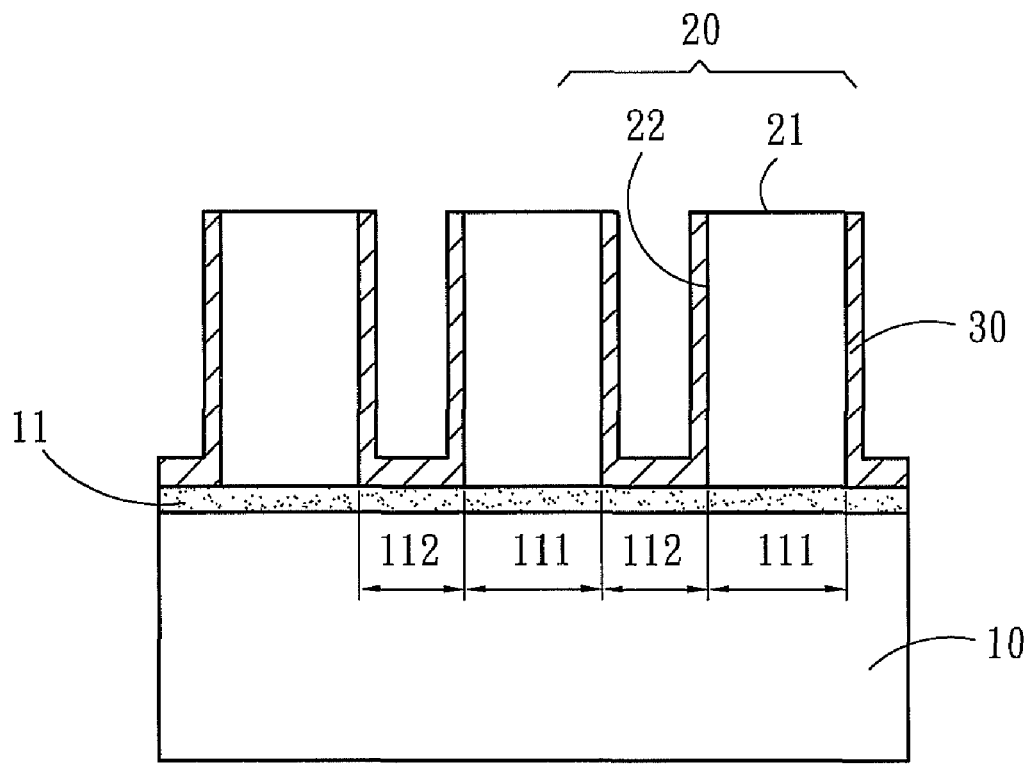
Figure 3C:
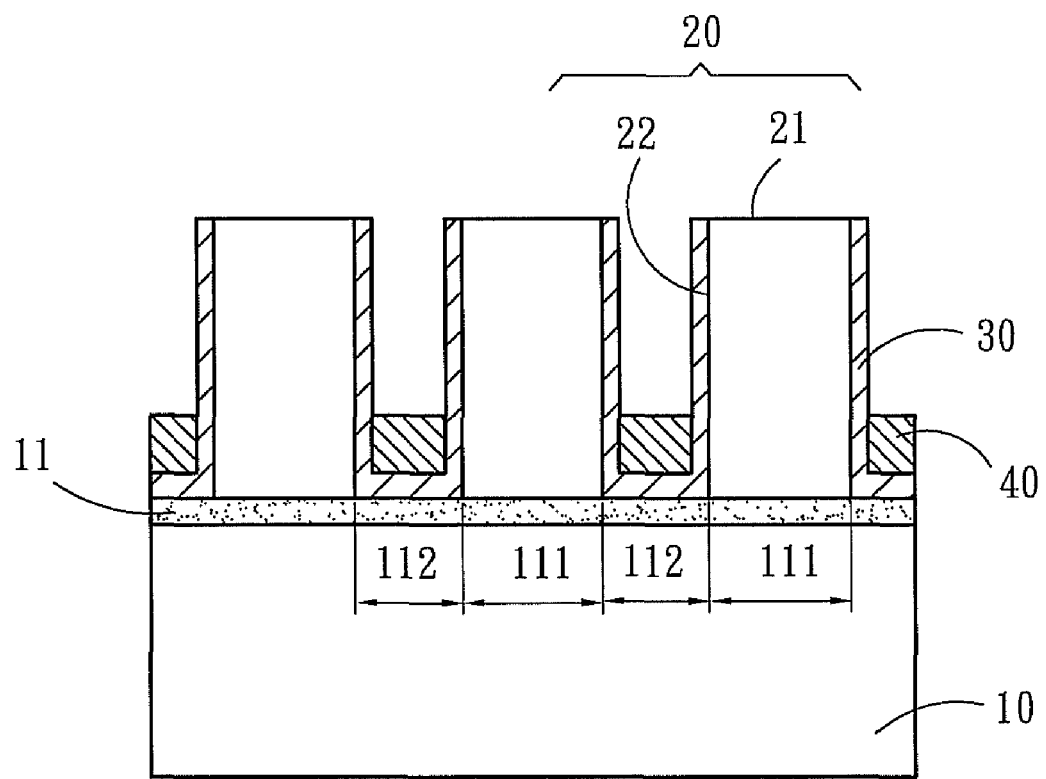
Figure 3D:
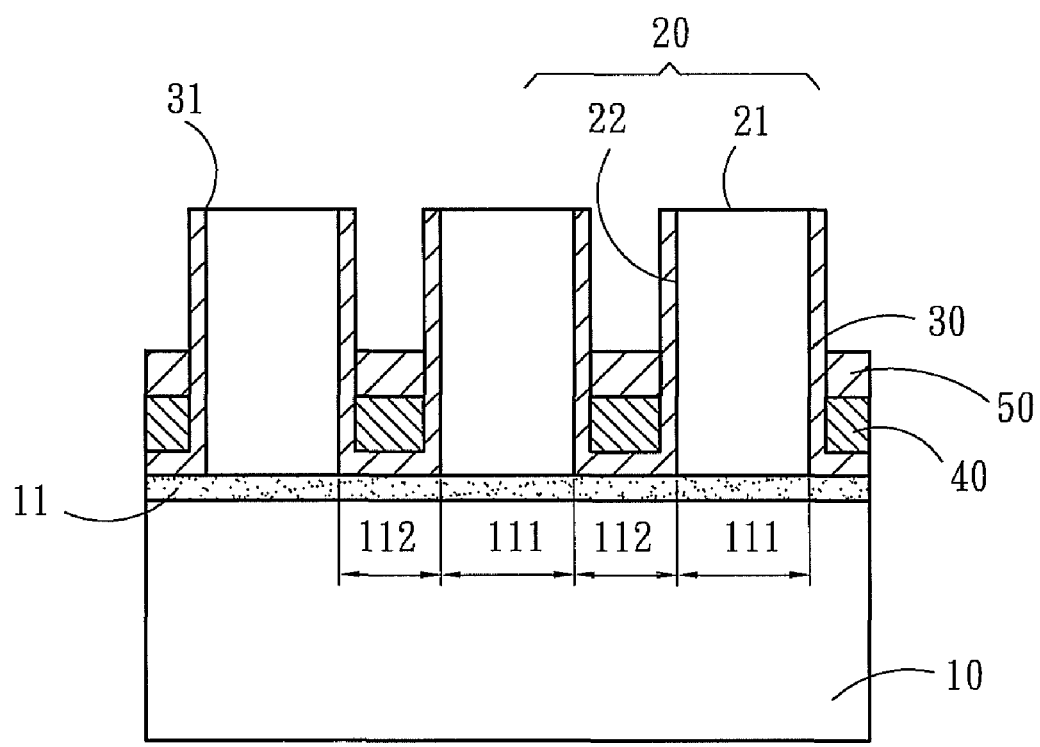

Referring to FIG. 3A, for undertaking fabrication, first, dope and diffuse a doping element on the substrate 10 to form the bit line 11; doping and diffusion can be undertaken through an ion implantation technique, a furnace doping and diffusion technique, a plasma diffusion technique or the like; and also form a plurality of pillar elements 20 on the character line 60. Referring to FIG. 3B, form the first dielectric layer 30 on the surface of the pillar elements 20 and bit line 11. Referring to FIG. 3C, form the ancillary electrode 40 between the pillar elements 20, namely on the corresponding separation zone 112. Referring to FIG. 3D, form the second dielectric layer 50 on the surface of the ancillary electrode 40 to connect to the first dielectric layer 30 and encase the ancillary electrode 40; the first and second dielectric layers 30 and 50 may be made of the same or different materials.

Figure 3E:
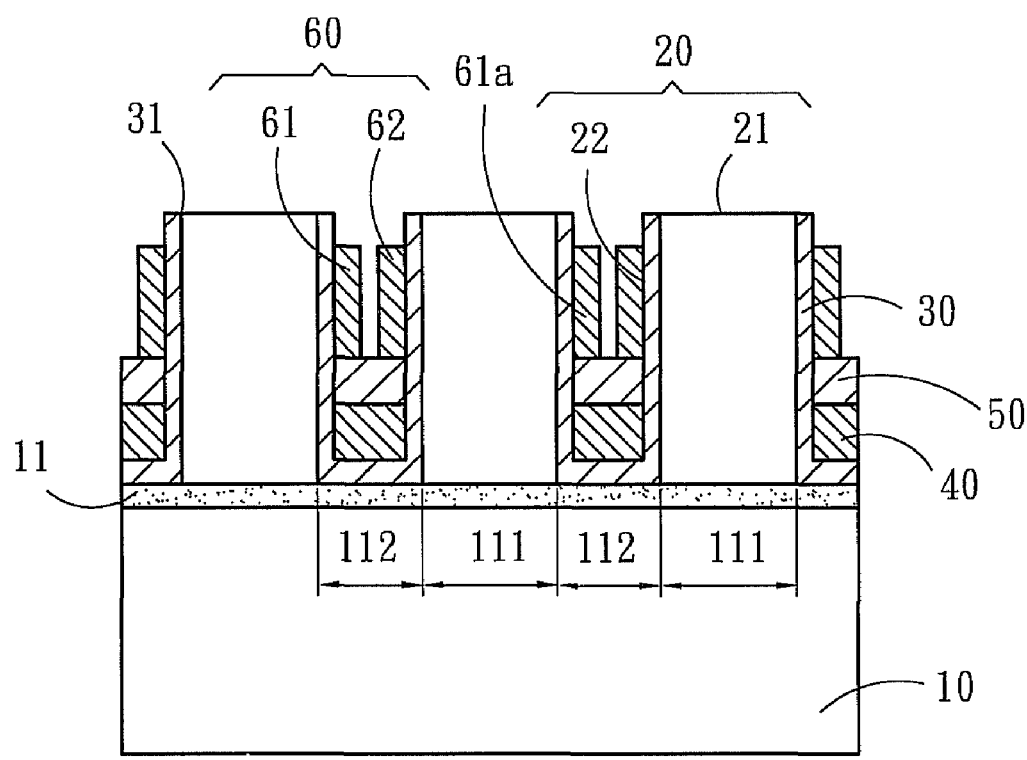
Figure 3F:
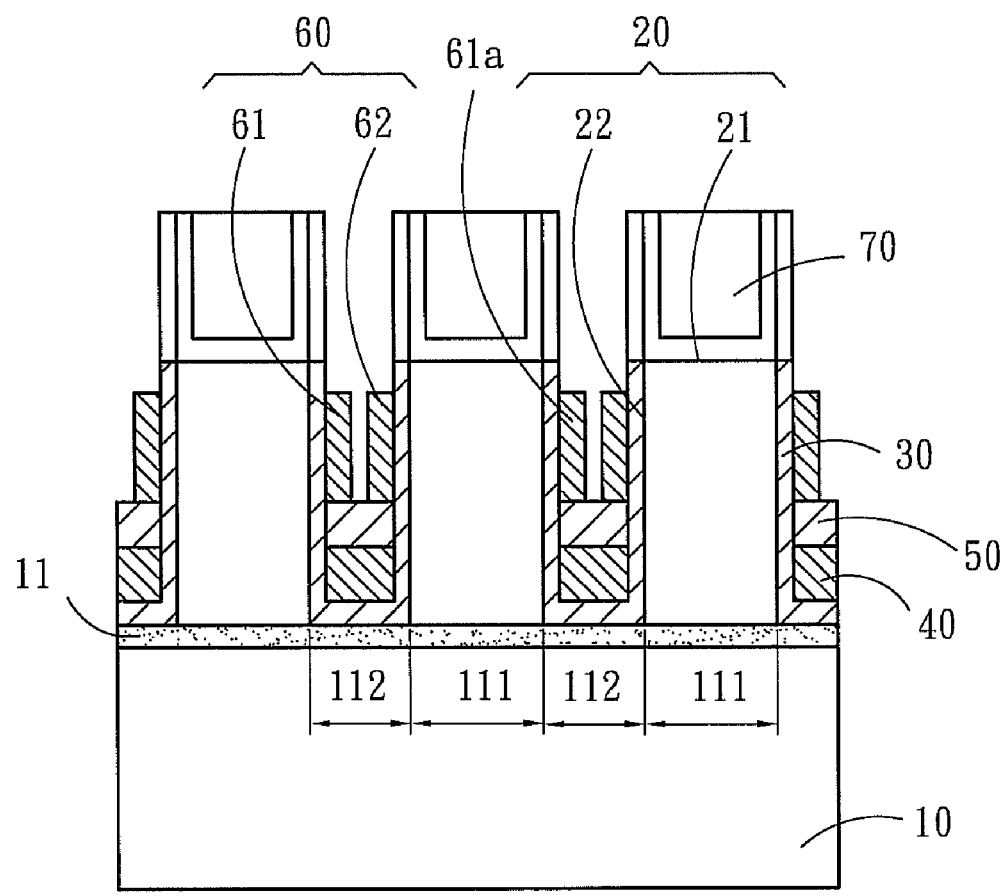

Referring to FIG. 3E, after the second dielectric layer 50 is formed, form the character line 60 on the second dielectric layer 50, and also form the first character line 61 and second character line 62 on the surface of neighboring side walls 22 of the pillar elements 20 by etching. The first character line 61 does not connect to the second character line 62. It is to be noted that, in practice the pillar element 20 can be doped with a desired element to serve as the source or drain of a transistor, while the first and second character lines 61 and 62 function as the gate of the transistor. Doping or forming the source and drain is a technique known in the art, thus details are omitted herein. Non-connection of the first and second character lines 61 and 62 means those on the neighboring side walls 22 of the pillar elements 20. However, the first character line 61a and second character line 62 on two side walls 22 of the same pillar 20 are electrically connected to each other to serve as the gate of the transistor. Finally, referring to FIG. 3F, dispose the capacitor 70 on the pillar element 20 to form the vertical DRAM.

Figure 4:
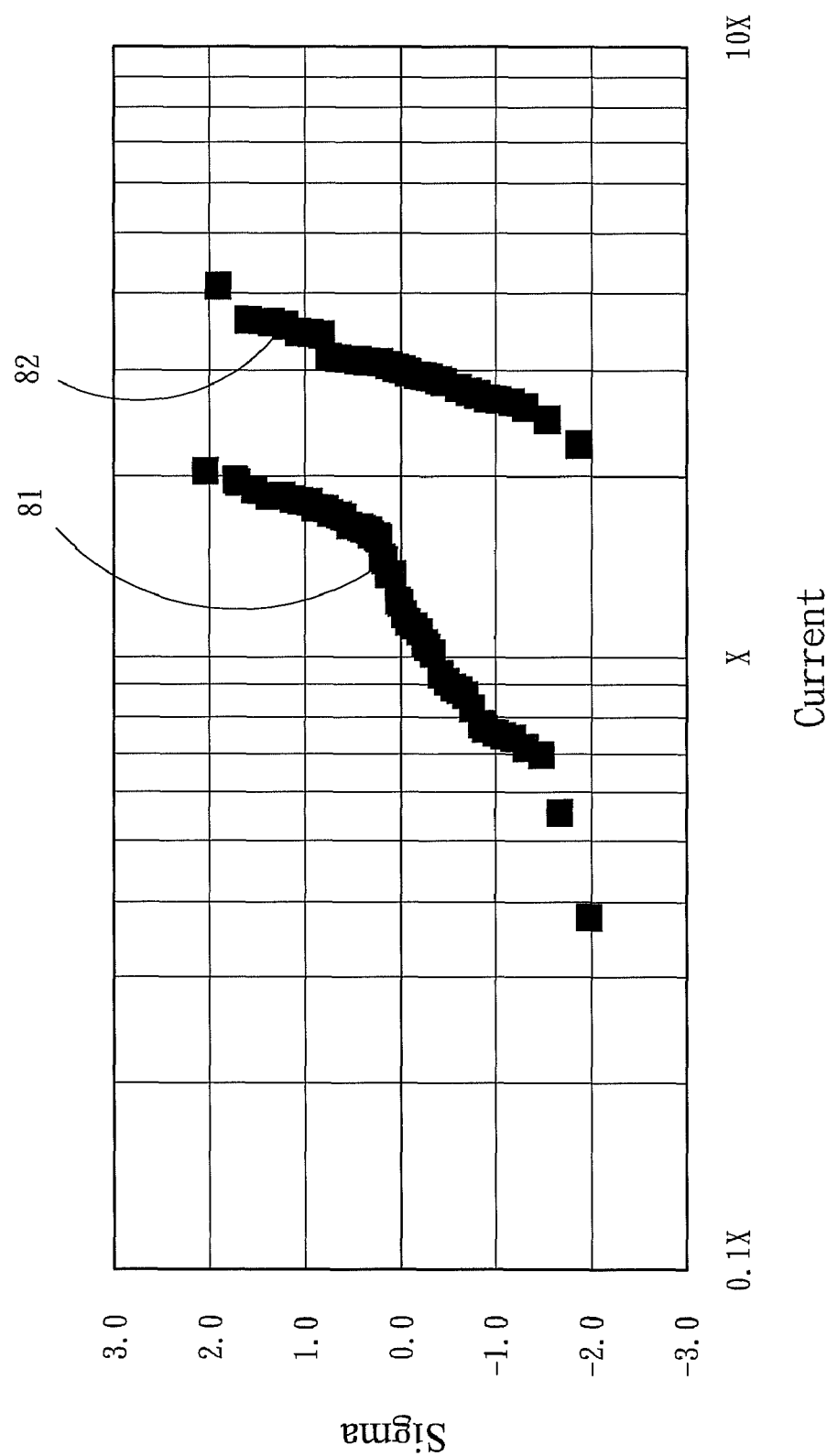
FIG. 4 is a chart showing current comparison of an embodiment of the invention.

Please refer to FIG. 4 for a chart of sigma comparison of the current of the invention and the conventional structure. Line 81 shows a conventional structure with unstable sigma at a current notably smaller than the invention shown by line 82, with the current about one third of the invention. The horizontal coordinate shows the current amount by logarithm coordinate. The sigma line 82 of the invention also is more linear and straight, indicating a smaller error after fabrication, thus can improve total stability and production yield.

As a conclusion, the invention uses the ancillary electrode 40 to control the amount of impedance of the bit line 11 formed by doping and diffusing, thereby can increase conductivity of the bit line 11 and prevent loss of electric charges saved in the capacitor 70. Moreover, the fabrication structure and process of the invention are similar to that of the vertical pillar transistor, thus provide higher fabrication compatibility. Actual test data show that the structure of the invention provides much higher stability than the conventional techniques, thus offers a significant improvement.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A three-dimensional dynamic random access memory with an ancillary electrode structure, comprising:
   a substrate;
   at least one bit line which is formed on the substrate by doping and diffusing a doping element and includes a growth zone and a separation zone;
   at least one pillar element which is formed on the growth zone of the bit line and includes a top wall remote from the bit line and a side wall between the bit line and the top wall, the side wall being perpendicular to the bit line, the top wall including an opening;
   a first dielectric layer formed on the separation zone of the bit line and a surface of the pillar element;
   at least one ancillary electrode formed on a surface of the first dielectric layer corresponding to the separation zone and adjacent to the pillar element;
   a second dielectric layer connecting to the first dielectric layer and encasing the ancillary electrode;
   at least one character line formed on the surface of the first dielectric layer remote from the side wall and parallel with a surface of the substrate and perpendicular to the bit line, and spaced from the ancillary electrode via the second dielectric layer; and
   at least one capacitor formed on the top wall of the pillar element and connected to the pillar element through the opening.

2. The three-dimensional dynamic random access memory of claim 1, wherein the first dielectric layer and the second dielectric layer are made of different materials.

3. The three-dimensional dynamic random access memory of claim 1, wherein the growth zone and the separation zone respectively include multiple sets spaced from each other, the pillar element including multiple sets corresponding to the growth zone.

4. The three-dimensional dynamic random access memory of claim 3, wherein the character line includes a first character line and a second character line that are located respectively on one side of neighboring side walls of the pillar elements without contacting with each other.

5. The three-dimensional dynamic random access memory of claim 3, wherein the bit line includes multiple sets parallel with and spaced from each other.

6. The three-dimensional dynamic random access memory of claim 5, wherein the ancillary electrode is located between the pillar elements and parallel with the surface of the substrate and perpendicular to the bit line.

7. The three-dimensional dynamic random access memory of claim 1, wherein the doping element is a 3A or 5A group element so that the bit line becomes a P-type or N-type semiconductor.

8. The three-dimensional dynamic random access memory of claim 1, wherein the bit line is formed by doping and diffusing the doping element in the substrate through an ion implantation technique, a furnace doping and diffusion technique or a plasma diffusion technique.

* * * * *